United States Patent [19]

Rano, Jr. et al.

[11] Patent Number: 5,286,426
[45] Date of Patent: Feb. 15, 1994

[54] ASSEMBLING A LEAD FRAME BETWEEN A PAIR OF MOLDING CAVITY PLATES

[75] Inventors: Albert V. Rano, Jr.; Romeo R. Castro; Benjamin O. Tee, all of Manila, Philippines

[73] Assignee: Allegro Microsystems, Inc., Worcester, Mass.

[21] Appl. No.: 861,723

[22] Filed: Apr. 1, 1992

[51] Int. Cl.$^5$ ............................................. B29C 45/14
[52] U.S. Cl. .............................. 264/40.1; 264/272.14; 264/272.15; 264/272.17; 425/171
[58] Field of Search ............... 264/40.1, 40.5, 40.2, 264/272.15, 272.17; 425/171

[56] References Cited

U.S. PATENT DOCUMENTS 4,829,168  5/1989  Nakahara ........................... 235/489

FOREIGN PATENT DOCUMENTS 277854    8/1988  European Pat. Off. ........ 264/272.15
60-189587 3/1984  Japan ............................... 264/272.15

Primary Examiner—Jan H. Silbaugh
Assistant Examiner—A. Y. Ortiz

[57] ABSTRACT

In a method for assembling a lead frame between two plate-mold cavity plates, a lead frame that includes a plurality of integrated circuit chips mounted spaced at intervals in a row thereon, is placed on a bottom one of the cavity plates which has a row of cavities spaced apart at the same intervals as the integrated circuit chips, each chip being positioned over a corresponding cavity. The bottom cavity plate is held about horizontal on the base plate of an assembly fixture. Two short guide pins extend upward from the cavity plate, the lead frame having two pilot holes directly above the guide pins. Accurate positioning of the lead frame will permit penetration of the pilot holes by the guide pins. When inaccurate positioning occurs, the lead frame will ride up on the guide pin(s) admitting ambient light into light-detecting holes formed in the bottom cavity plate, and a light detection system in the assembly fixture, including photo-detectors at each hole and a signal generating circuit, will generate a warning signal that may in turn generate a warning light or sound to advise an operator to reposition the lead frame accurately.

3 Claims, 2 Drawing Sheets

ASSEMBLING A LEAD FRAME BETWEEN A PAIR OF MOLDING CAVITY PLATES

BACKGROUND OF THE INVENTION

This invention relates to the plastic molding of electronic components that are first mounted on a metal lead frame, and more particularly relates to the assembly of a pair of cavity plates with a lead frame sandwiched therebetween, which assembly is subsequently placed between two heated flat mold platens before compressing this stack and introducing a liquid plastic into the cavities surrounding the individual components.

Molds of this kind are often referred to as plate molds, and offer the advantage of assembling the lead frame to unheated cavity plates that are unencumbered by platens. Also the platens may be absolutely flat, i.e. they need not contain cavities in their surfaces, and are much easier to keep clean.

The assembly begins by positioning the lead frame over the bottom cavity plate so that pilot holes therein are registered about directly over guide pins that extend upwardly from the bottom cavity plate. The guide pins are very short, namely no longer than the thickness (e.g. 0.020 inches) of the metal lead frame. Then by pressing down on the lead frame the pins penetrate the pilot holes so that metal portions of the lead frame lie flush with the top surface of the bottom cavity plate. In this position the electronic components are each adjacent a cavity of the bottom cavity plate.

At this step, however, the operator who may be assembling many lead frames on the bottom cavity plate, can easily fail to exactly register the pilot holes to the guide pins which results in the lead frame riding up on at least one guide pin. Such a slight elevation of a mis-registered lead frame is difficult to see, and when a cavity plates assembly containing a mis-registered lead frame is compressed, both the lead frame with its plurality of components and the expensive bottom cavity plate may be seriously damaged.

It is an object of this invention to provide a method for overcoming the above noted shortcomings of the prior art plate molding methods.

SUMMARY OF THE INVENTION

A method for assembling a lead frame strip within a pair of mold-plate cavity plates to form a sandwich assembly ready for molding includes placing a metal lead frame strip on the bottom of the cavity plates, the lead frame strip having a multiplicity of electronic components mounted to the strip at intervals commensurate with the intervals of said cavities in the bottom cavity plate. This is to accomplish positioning of the electronic components over corresponding of the bottom-plate cavities. Each of the lead frame strips have two pilot holes that at the positioning lie about registered with two guide pins provided therefor in a face of the bottom plate.

The bottom cavity plate has two light-detection holes extending through the bottom cavity plate and underlying metal portions of said lead frame that are not to be mold encapsulated. A light-detection means is connected to the bottom plate for sensing light in the light-detection holes and generating a warning signal when a lead-frame-strip pilot hole is not exactly registered and thus the lead frame rides up on the pin, or is displaced aside the pin, so that the lead frame strip is not seated to the bottom cavity plate and ambient light is not blocked from entering the light-detection holes.

In response to the warning signal, the lead frame strip is repositioned, to accurately align the pins with said pilot holes and seat said lead frame strip flush with the bottom cavity plate to block ambient light from said light detection holes. The top one of the pair of cavity plates is then fitted over the bottom cavity plate and lead frame strip with the guide posts threaded into guide holes provided therefor in the top cavity plate.

DESCRIPTION OF THE PREFERRED EMBODIMENT

Figure 1:
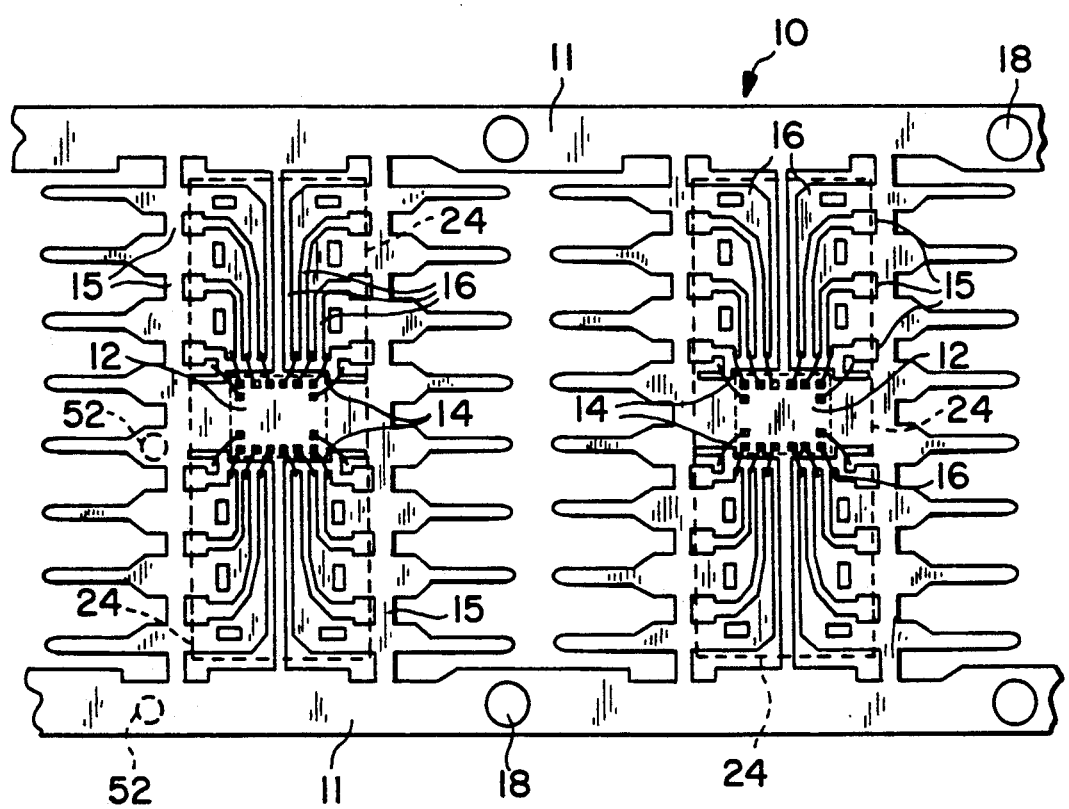
FIG. 1 shows in bottom view a portion of a metal lead frame strip having integrated circuit chips mounted thereon.

The lead frame 10 of FIG. 1 has silicon integrated circuit chips 12 mounted at intervals along the strip 10. Each chip 12 is electrically connected by sixteen fine wires 14 to lead frame fingers 16. Pilot holes 18 regularly spaced along the outer edges of strip 10 were employed for registering each section of the lead frame strip in assembly stations (not shown) in which a chip 12 is mounted and in which wires 14 are thermo-compression bonded to the lead frame fingers 16. Such a lead frame strip is described in more detail in the patent to Gagnon, U.S. No. 4,916,506 issued Apr. 10, 1990 and assigned to the same assignee as is the present invention.

Figure 2:
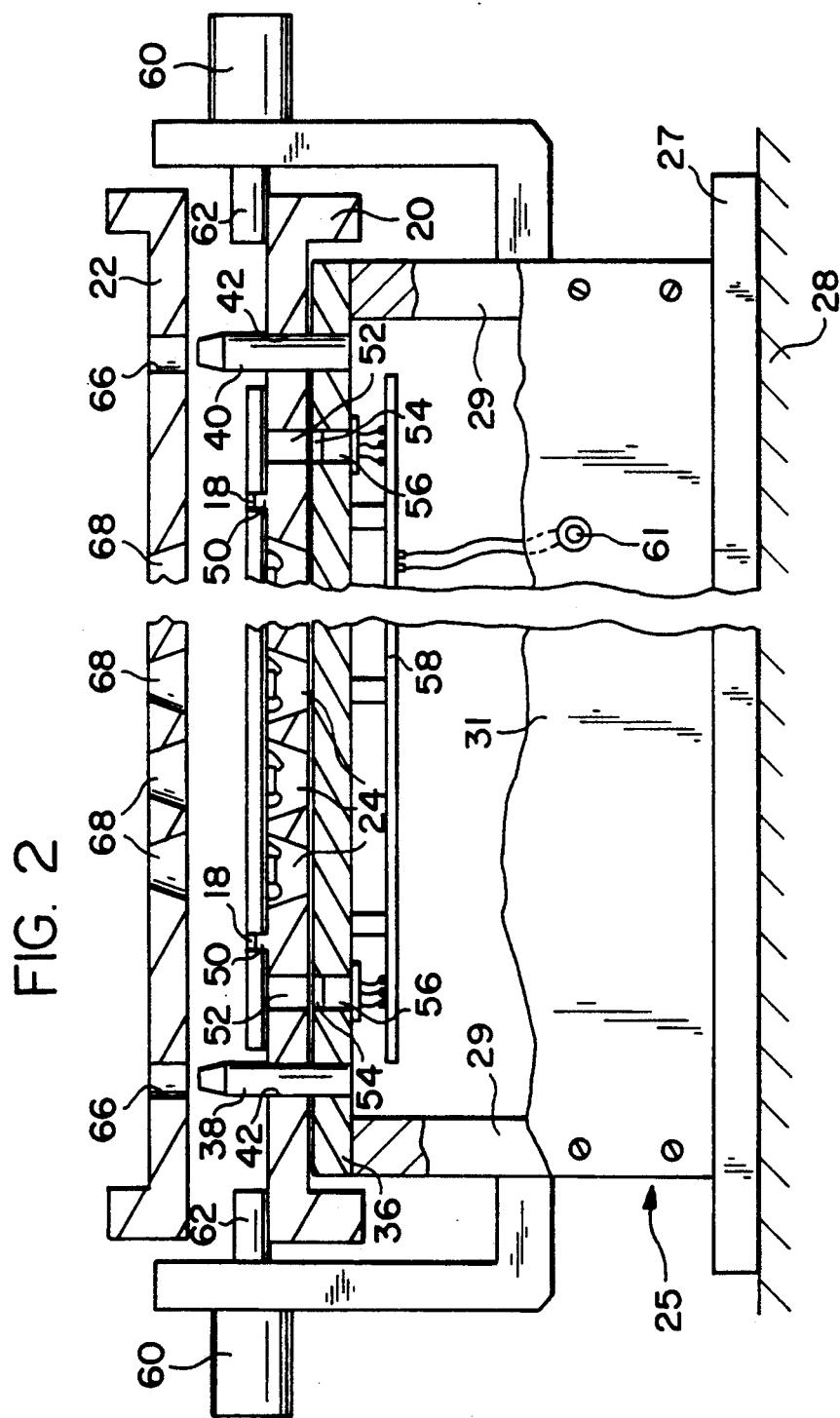
FIG. 2 shows in side view a lead-frame mold assembly fixture including, broken away in side sectional view, a pair of cavity plates with a lead frame strip therebetween.

A fully assembled lead frame typically carries 24 integrated circuit chips 12. The next steps in manufacture are to form an encapsulating plastic body about each chip 12 and then cut away parts of the lead frame that extend from each plastic body that are not needed. This is accomplished by sandwiching the lead frame strip between two cavity plates 20 and 22 as shown in FIG. 2, having cavities 20 that surround each integrated circuit chip 12 including portions of the lead frame fingers 16. The perimeter of the cavities 20 and 22 about each lead frame strip 10 is indicated in FIG. 1 as a dashed line 24.

Lead frame strip regions lying outside the perimeter of the mold cavities 24 will, in the completed mold assembly, be contacted by the flat mating portions of the bottom and top cavity plates 20 and 22. After molding, the lead frame strip 10 with individually encapsulated integrated circuit chips 12 will be placed in a punch for removing the dam bars 15 and the outer rails 11 of the lead frame strip 10, so that each individual encapsulated chip 12 is separated from strip 10 and so that each lead-frame lead 13 is electrically separated from the adjacent lead 13.

The two cavity plates 20 and 22 are part of a plate type mold, so that lead frame strips may be assembled for molding away from the mold press and platens (not shown). Cavities 24, spaced at intervals in a row in the bottom cavity plate 20, extend completely through cavity plate 20.

The assembly fixture 25 has a base consisting of a foot plate 27 for being set on a horizontal supporting table surface 28, side walls 29, end walls 31, and a base plate 36. The base plate 36 has two upwardly extending guide posts 38 and 40.

The bottom cavity plate 20 is placed flush against the base plate 36 with the guide posts 38 and 40 extending through two holes 42 and 44 provided in the bottom cavity plate 20. The lead frame strip 10 is then positioned over the bottom cavity plate 20 so that the integrated circuit chips 12 are about registered with the row of cavities 24, and with the further intent that registration is achieved between a pair of short guide pins 50 extending upwardly from the bottom cavity plate 20 and two pilot holes 18 of the lead frame strip 10. As is noted above, it would be disastrous to proceed with the assembly of the top cavity plate 22 and subsequent transfer of the cavity plates with lead frame strip assembly to the mold press for molding, if the lead frame strip 10 had not seated against the bottom cavity plate 20 with guide pins 50 penetrating pilot holes 18.

An unseated lead frame strip 10, riding up slightly on one or two of the short guide pins 50 is difficult to see. Referring again to FIG. 2, a pair of holes 52 are provided in the bottom cavity plate 20 located under a portion of the lead frame strip 10 lying outside the peripheries of the mold cavities 24. Two such positions of the holes 52 are illustrated in FIG. 1 by dashed circles. When the lead frame strip is riding up on a guide pin 50 and cannot seat properly against bottom cavity plate 20, ambient light is admitted into hole 52.

For detecting the light, and thus the mis-registration, a corresponding hole 54 is provided in the bottom cavity plate 20, and a photo transistor 56 is mounted into each hole 54. A printed wiring board 58 is mounted under the base plate 36 and includes electronic circuits (not illustrated) of which photo transistors 56 are an external part. The printed wiring board also includes a circuit connected between the solenoids 60 and a push button switch 61 that may be pressed by an operator for activating the solenoids 60 and retracting the solenoid cores 62 to make it possible initially to load the bottom cavity plate 20 onto the base plate 36. Solenoid cores 62 are spring loaded and shown in FIG. 2 in the position for which the corresponding solenoids 60 are not activated. Also, unless the solenoid cores 62 are retracted by activating solenoids 60, they will interfere with any attempt to assemble the top cavity plate 22 with the underlying lead frame strip 10 and bottom cavity plate 20.

When light is admitted into any hole 56 in the bottom base plate 20 owing to mis-registration of a lead frame strip, one of the photo transistors 56 will become conducting, causing the printed wire board circuit to provide an output signal for sounding an audible alarm or turning on a warning light (not shown). The warning signal generated by a conducting photo transistor 56 will also deactivate, via the printed wire board circuit, the solenoids 60 to prevent removal of the bottom cavity plate 20 from the assembly fixture so long as a lead frame strip 10 is not seated properly.

More than one lead frame strip may be assembled between the same pair of cavity plates, and in fact it is not unusual to so load 40 to 50 strips for simultaneous molding. In such a case any one mis-registered and improperly seated lead frame strip will generate the warning signal. Only when all lead frame strips are properly seated will there be no warning signal generated, and assembly of the top cavity plate 22 will be made possible. The assembled top cavity plate 22 also has guide holes 66 that will be penetrated by guide posts 38 and 40 when assembled flush and in contact with the top metal surfaces of the lead frames 10. The cavities 68 of top plate 22 then are aligned with cavities 24 of the bottom plate 20.

What is claimed is:

1. A method for assembling a lead frame strip within a pair of mold plates to form a sandwich assembly ready for molding comprising:
   a) placing a metal lead frame strip on a bottom one of a mating pair of mold plates, each of said mold plates having a row of cavities therein spaced apart by identical intervals, said lead frame strip having a multiplicity of electronic components mounted to said strip at intervals commensurate with the intervals of said cavities in said mold plates, said placing including positioning said electronic components over corresponding of said bottom-plate cavities, said bottom mold plate having two lead-frame guide pins extending upwardly therefrom, said lead frame strip having two pilot holes that at said positioning lie about registered with and directly above said two guide pins;
   said bottom mold plate having two light-detection holes underlying metal portions of said lead frame that are not registered with any one of said bottom-plate cavities,
   b) sensing whether light is being admitted in said light-detection holes;
   c) generating a warning signal when light is sensed in one of said light-detection holes, indicating that one of said lead-frame pilot holes has into exactly registered with the corresponding of said guide pins, and that said lead frame strip rides upon on said corresponding guide pin and has not seated to said bottom mold plate so that ambient light is not blocked from entering said light-detection hole;
   d) repositioning said unseated lead frame strip to a coarsely align said pins with said pilot holes and seat said lead frame strip flush with said bottom mold plate to block ambient light from said light detection holes; and
   e) fitting the other one of said pair of mold plates over said bottom mold plate and lead frame strip.

2. A method for assembling a lead frame strip within a pair of mold plates comprising:
   a) providing an assembly fixture having a horizontal base plate, two guide posts fixed to said base plate and extending upwardly therefrom;
   b) fitting a bottom one of a pair of mold plates on and flush with said fixture base plate with said guide posts extending upwardly through corresponding guide holes provided therefor in said bottom mold late, said bottom molds plate having a row of cavities spaced at intervals in said row, said cavities extending through said bottom mold plate and having at least two lead-frame guide pins extending upwardly therefrom;
   c) placing a metal lead frame strip on said bottom mold plate, said lead frame strip having a multiplicity of electronic components mounted to said strip at intervals commensurate with the intervals of said cavities in said bottom mold plate, said placing including positioning said electronic components over corresponding of said bottom-place cavities, said lead frame strip having two pilot holes that at said positioning lie about registered with and directly above said two guide pins;

said bottom mold place having two light-detection holes underlying said metal portions of said lead frame that are not registered with any one of said cavities, d) sensing whether light is being admitted in said light-detection holes;

d) generating a warning signal when light is sensed in one of said light-detection holes, indicating that one of said lead-frame pilot holes has not exactly registered with the corresponding of said guide pins, and that said lead frame strip rides upon on said corresponding guide pin and has not seated to said bottom mold plate so that ambient light is not blocked from entering said light-detection hole; and f) repositioning said unseated lead frame strip to accurately align said pins with said pilot holes and seat said lead frame strip flush with said bottom mold plate to block ambient light from said light detection holes.

3. The method of claim 2 additionally comprising fitting the top one of said pair of mold plates over said bottom mold plate and over said lead frame strip with said guide posts threaded into guide holes provided therefor in said top mold plate, said fitting including registering said top-place cavities over said bottom-plate cavities.

* * * * *